United States Patent
Eaglesham et al.

(10) Patent No.: US 12,221,710 B2
(45) Date of Patent: Feb. 11, 2025

(54) MITIGATION OF ELECTRIC SHORT CIRCUIT IN A POLYMER ELECTROLYTE MEMBRANE WATER ELECTROLYZER

(71) Applicant: ELECTRIC HYDROGEN CO., Natick, MA (US)

(72) Inventors: David Eaglesham, Lexington, MA (US); Eduard Nasybulin, Sudbury, MA (US); Tenzin Nanchung, Somerville, MA (US); Jigish Trivedi, Pleasanton, CA (US)

(73) Assignee: ELECTRIC HYDROGEN CO., Devens, MA (US)

( * ) Notice: Subject to any disclaimer, the term of this patent is extended or adjusted under 35 U.S.C. 154(b) by 0 days.

(21) Appl. No.: 18/686,596

(22) PCT Filed: Jan. 6, 2023

(86) PCT No.: PCT/US2023/010313
§ 371 (c)(1),
(2) Date: Feb. 26, 2024

(87) PCT Pub. No.: WO2023/133270
PCT Pub. Date: Jul. 13, 2023

(65) Prior Publication Data
US 2024/0337035 A1     Oct. 10, 2024

Related U.S. Application Data

(60) Provisional application No. 63/296,949, filed on Jan. 6, 2022.

(51) Int. Cl.
C25B 15/06     (2006.01)
C25B 13/08     (2006.01)

(52) U.S. Cl.
CPC ............. *C25B 15/06* (2013.01); *C25B 13/08* (2013.01)

(58) Field of Classification Search
None
See application file for complete search history.

(56) References Cited

U.S. PATENT DOCUMENTS

| | | | | |
|---|---|---|---|---|
| 4,431,495 A | * | 2/1984 | Fair | C25B 9/73 205/516 |
| 4,623,440 A | * | 11/1986 | Cairns | G01N 27/30 204/252 |
| 5,266,350 A | * | 11/1993 | Grob | C25B 13/04 427/140 |
| 5,746,954 A | * | 5/1998 | Aikman, Jr. | C08J 7/0427 264/340 |

(Continued)

OTHER PUBLICATIONS

Written Opinion of the International Searching Authority for PCT/US2023/010313, mailed Apr. 14, 2023, pp. 1-13.

*Primary Examiner* — Harry D Wilkins, III
(74) *Attorney, Agent, or Firm* — Lempia Summerfield Katz LLC

(57) ABSTRACT

The following disclosure relates to methods of identifying defects (e.g., short circuits) in a membrane of an electrolytic cell. The following disclosure further relates to methods of repairing such a defect in the membrane of the electrolytic cell, particularly without having to disassemble the membrane from adjacent components of the electrolytic cell.

23 Claims, 10 Drawing Sheets

(56) References Cited

U.S. PATENT DOCUMENTS

| | | | |
|---|---|---|---|
| 5,773,079 A * | 6/1998 | Bohnstedt | B29C 73/02 |
| | | | 427/256 |
| 6,071,386 A * | 6/2000 | Puthawala | C25B 9/19 |
| | | | 204/283 |
| 6,483,275 B1 | 11/2002 | Nebrigic et al. | |
| 7,618,527 B2 * | 11/2009 | Schussler | C25B 1/46 |
| | | | 205/350 |
| 2006/0234097 A1 | 10/2006 | Boehm et al. | |
| 2007/0045105 A1 * | 3/2007 | Schussler | C25B 1/46 |
| | | | 204/232 |
| 2008/0220210 A1 | 9/2008 | McLean et al. | |
| 2009/0027056 A1 | 1/2009 | Huang et al. | |
| 2009/0226773 A1 | 9/2009 | Takekawa | |
| 2010/0187127 A1 * | 7/2010 | Zhou | B01D 61/52 |
| | | | 204/295 |
| 2010/0326500 A1 | 12/2010 | Watanabe et al. | |
| 2013/0260207 A1 | 10/2013 | Uemura | |
| 2014/0030815 A1 | 1/2014 | Park et al. | |
| 2015/0021193 A1 * | 1/2015 | Verfu | C25B 1/46 |
| | | | 204/229.8 |
| 2017/0279088 A1 | 9/2017 | Reinshagen et al. | |
| 2019/0269355 A1 | 9/2019 | Wang et al. | |
| 2019/0280523 A1 | 9/2019 | Horovitz et al. | |
| 2020/0028165 A1 * | 1/2020 | Chiang | H01M 4/405 |
| 2022/0064807 A1 * | 3/2022 | Lewis | C25B 9/23 |

* cited by examiner

MITIGATION OF ELECTRIC SHORT CIRCUIT IN A POLYMER ELECTROLYTE MEMBRANE WATER ELECTROLYZER

The present patent document is a § 371 nationalization of PCT Application Serial No. PCT/US2023/010313, filed Jan. 6, 2023, designating the United States, which claims the benefit of U.S. Provisional Patent Application No. 63/296,949, filed Jan. 6, 2022, which are hereby incorporated by reference in their entireties.

FIELD

The following disclosure relates to methods of identifying defects (e.g., short circuits) in a membrane of an electrolytic cell and/or repairing defects in the membrane of the electrolytic cell, particularly without having to disassemble the membrane from adjacent components of the electrolytic cell.

BACKGROUND

An electric short circuit (SC) may be formed during an electrolysis run of a polymer electrolyte membrane (PEM) water electrolytic cell (e.g., having an aqueous solution) as one common failure mode. An electric short circuit may start with a soft SC (SSC) where only a small portion of current (e.g., <1%) bypasses the electrochemical process, thereby lowering a Faradaic efficiency of the electrolysis. An electric SSC may be caused by defects or inhomogeneities in an MEA, resulting in uneven current distribution. MEA fabrication processes require pressure application to laminate catalyst layers with a thin proton-conducting membrane. Unevenness, agglomerates, or external contaminants may penetrate into the membrane, either shorting the MEA when the two catalyst layers contact one another directly or through the conducting defect, or by creating a hot spot when the defect only partially penetrates into the membrane and thinning it. The latter case may be difficult to detect by standard quality control methods.

In certain examples, an electrolytic cell may include a fibrous gas diffusion layer (GDL) adjacent to a cathode flow field and a fibrous porous transport layer (PTL) adjacent to an anode flow field within the electrochemical cell. Fibers in the GDL and PTL may poke or puncture the membrane partially or fully (e.g., breach the integrity of porous transporting layers) at the cell assembly step when the stack pressure is applied. In one example, a full puncture through the membrane by a fiber may result in a hard short circuit (HSC) between the fiber and the cathode flow field or anode flow field to which the membrane is applied. In another example, a "hot spot" may be present when there is a partial puncture of the membrane, so called because of the uneven current distribution (e.g., localized greater current density) at the partial puncture during the electrolysis process. Over time, the hot spots may develop an SSC during the cell operation because of the high current density at the "hot spot." Eventually, the puncture or breach of integrity of the transport layers may expand or deepen, and the SSC may develop into an HSC.

SUMMARY

In certain embodiments, methods of repairing a membrane of an electrolytic cell are provided. The methods repairing the defect in the membrane without disassembling the membrane from adjacent components of the electrolytic cell.

In one example, the repairing includes: drying the electrolytic cell; providing an inert atmosphere and/or vacuum to the electrolytic cell; and operating the electrolytic cell at a specified voltage at which at least of a portion of the membrane liquefies and the defect in the membrane is repaired.

In another example, the repairing includes drying the electrolytic cell; providing a thermally-activated vapor precursor to the electrolytic cell; and operating the electrolytic cell at a specified voltage, wherein the thermally-activated vapor precursor is configured to react or decompose and deposit a composition at a site of the defect in the membrane.

In another example, the repairing includes providing a first reagent to the electrolytic cell on a first side of the membrane; and providing a second reagent to the electrolytic cell on a second side of the membrane opposite the first side, wherein the first reagent and the second reagent react at a site of the defect in the membrane to repair the defect in the membrane. The repairing may further include operating the electrolytic cell at a specified voltage to control a temperature at the membrane and facilitate a reaction between the first reagent and the second reagent.

In another example, the repairing includes providing a reagent to the electrolytic cell; and polymerizing the reagent at a site of the defect in the membrane to repair the defect in the membrane. The repairing may further include operating the electrolytic cell at a specified voltage to control a temperature at the membrane and facilitate a polymerization reaction of the reagent.

In another example, the repairing includes adding a compound within water to an anode side of the membrane and/or a cathode side of the membrane; and providing a pressure differential across the membrane, wherein the compound has a diameter that is larger than an opening in the membrane, and wherein the pressure differential causes the water having the compound to flow across the membrane at which the compound plugs the opening in the membrane and repairs the defect.

In a further embodiment, a method of identifying a defect in a membrane of an electrolytic cell is provided. The method includes: measuring a resistance of the electrolytic cell in response to a varied input current, wherein the defect is identified by a decrease in the resistance of the electrolytic cell in comparison to a known resistance value of the electrolytic cell; measuring an open current voltage of the electrolytic cell, wherein the defect is identified by a voltage decaying to zero volts within a defined observation period; measuring a degradation of a voltage of the electrolytic cell; measuring a rate of heat generation of the electrolytic cell; or measuring a current leakage of the electrolytic cell at a test voltage below an electrolysis voltage, wherein the defect is identified by the current leakage exceeding a predefined threshold value.

In further embodiments, methods of repairing a membrane of an electrolytic cell is provided. The methods include identifying a defect in the membrane of the electrolytic cell; and repairing the defect in the membrane without disassembling the membrane from adjacent components of the electrolytic cell.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Exemplary embodiments are described herein with reference to the following drawings.

DETAILED DESCRIPTION

Methods for detecting faults or defects within electrolytic cells and repairing those defects are described below. Specifically, methods are provided for detecting and repairing defects within a membrane of the electrolytic cell without removing or dissembling the membrane from the adjacent components of the cell. These methods may be advantageous in extending the life of the membrane of the cell and/or improving the operating performance of the cell.

Figure 1A:
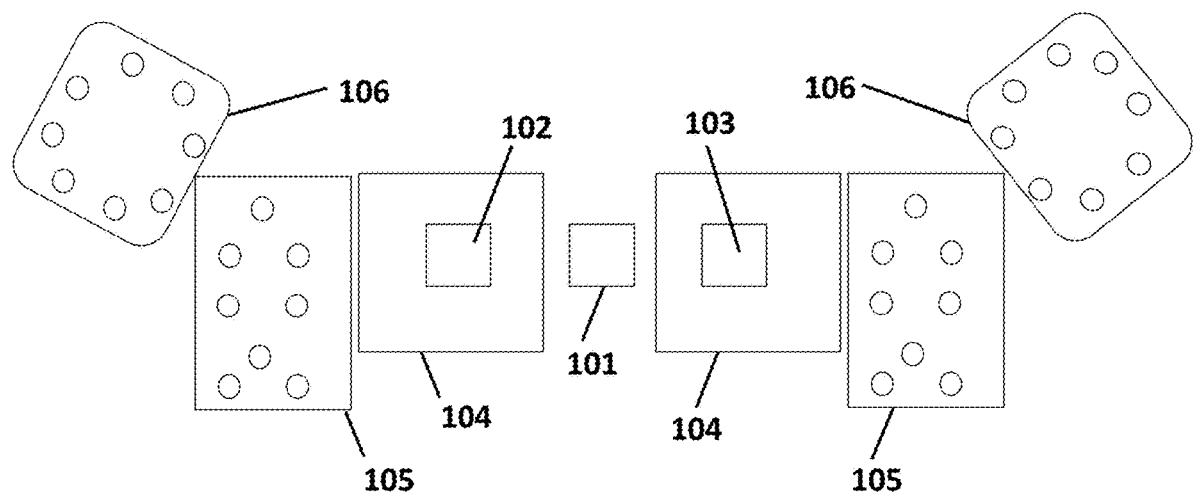
FIG. 1A depicts an example of elements of a polymer electrolyte membrane electrolytic cell.
Figure 1B:
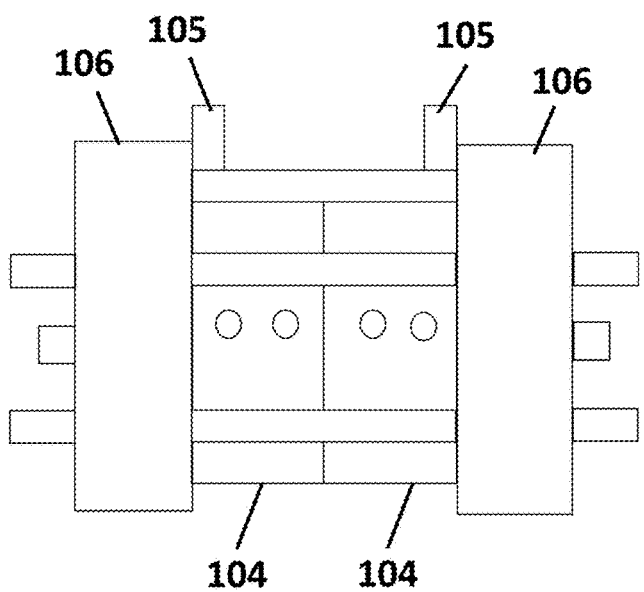
FIG. 1B depicts an example of a polymer electrolyte membrane electrolytic cell having the elements of FIG. 1A.

FIG. 1A depicts an example of elements of a proton exchange membrane (PEM) electrolytic cell. The cell includes a membrane electrode assembly (MEA) 101 (e.g., an ion exchange membrane), a porous transport layer (PTL) 102, a gas diffusion layer (GDL) 103, flow fields 104, current collectors 105, and end plates 106. FIG. 1B depicts an example of a polymer electrolyte membrane electrolytic cell having the elements of FIG. 1A. When an external current is applied to the cell via the current collectors 105, ions (e.g., H+ ions) move away from an anode toward a cathode Current flows through the layers between the current collectors, such as the flow fields 104, the GDL 103, the PTL 102, and the MEA 101.

Figure 2:
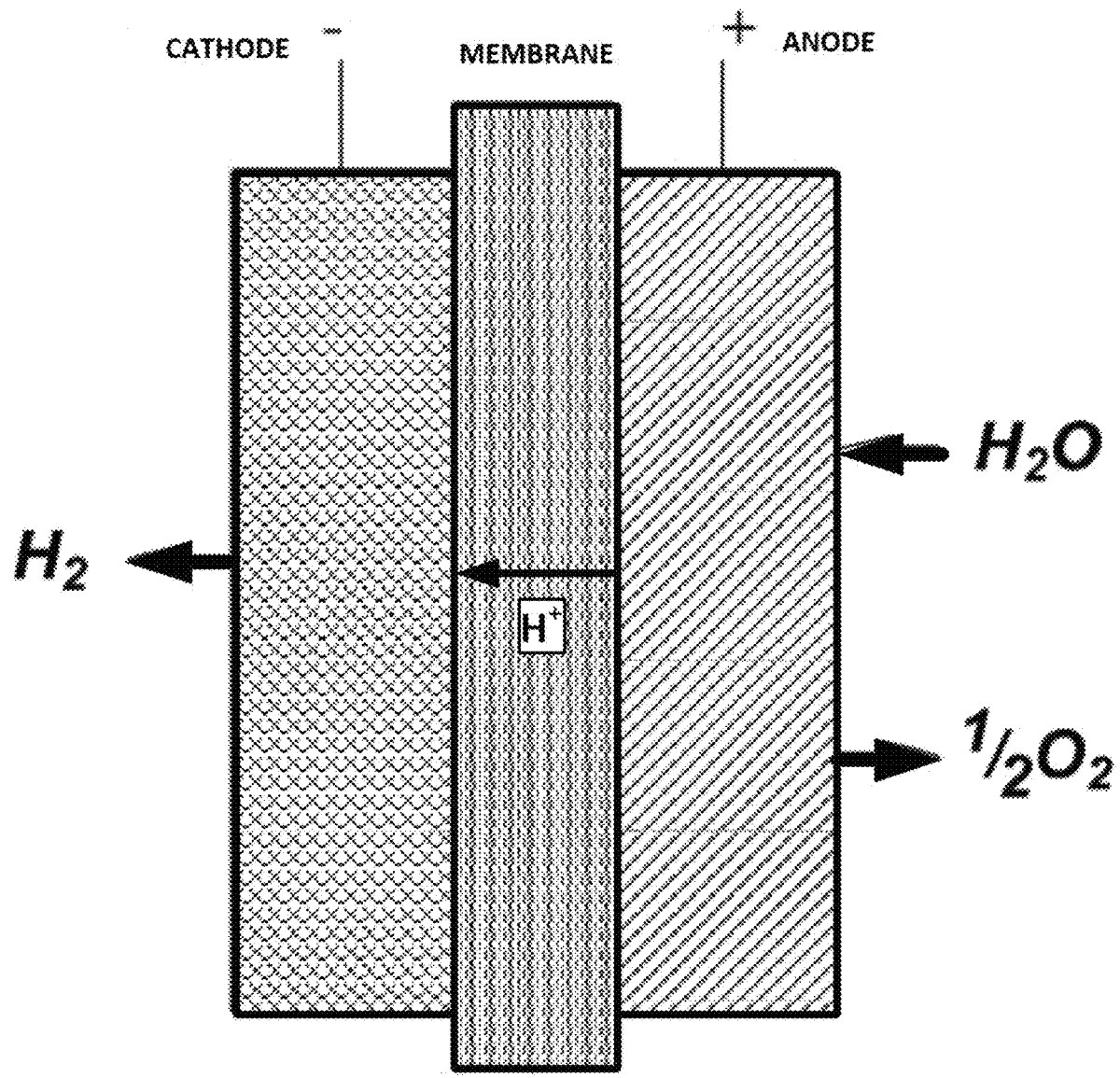
FIG. 2 depicts an example of an electrolytic cell.

FIG. 2 depicts an additional example of an electrolytic cell for the production of hydrogen gas and oxygen gas through the splitting of water. The electrolytic cell includes a cathode, an anode, and a membrane positioned between the cathode and anode. The membrane may be a proton exchange membrane (PEM). Proton Exchange Membrane (PEM) electrolysis involves the use of a solid electrolyte or ion exchange membrane. Within the water splitting electrolysis reaction, one interface runs an oxygen evolution reaction (OER) while the other interface runs a hydrogen evolution reaction (HER). For example, the anode reaction is $H_2O \rightarrow 2H^+ + \frac{1}{2} O_2 + 2e$ and the cathode reaction is $2H^+ + 2e \rightarrow H_2$. The water electrolysis reaction has recently assumed great importance and renewed attention as a potential foundation for a decarbonized "hydrogen economy."

Figure 3:
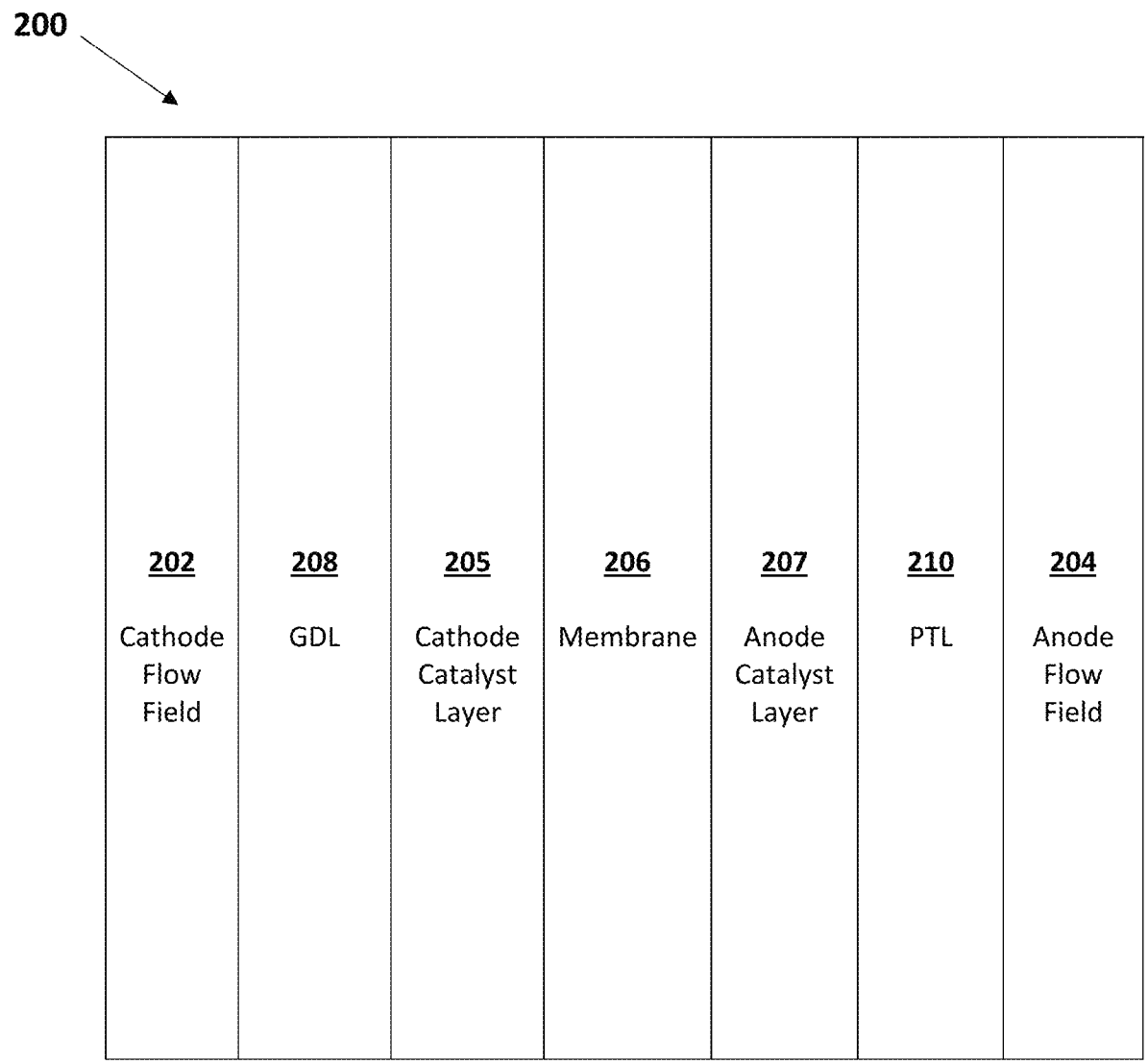
FIG. 3 depicts an additional example of an electrolytic cell.

FIG. 3 depicts an additional example of an electrochemical or electrolytic cell. Specifically, FIG. 3 depicts a portion of an electrochemical cell 200 having a cathode flow field 202, an anode flow field 204, and a membrane 206 positioned between the cathode flow field 202 and the anode flow field 204.

In certain examples, the membrane 206 may be a catalyst coated membrane (CCM) having a cathode catalyst layer 205 and/or an anode catalyst layer 207 positioned on respective surfaces of the membrane 206. As used throughout this disclosure, the term "membrane" may refer to a catalyst coated membrane (CCM) having such catalyst layers.

In certain examples, additional layers may be present within the electrochemical cell 200. For example, one or more additional layers 208 may be positioned between the cathode flow field 202 and membrane 206. In certain examples, this may include a gas diffusion layer (GDL) 208 may be positioned between the cathode flow field 202 and membrane 206. This may be advantageous in providing a hydrogen diffusion barrier adjacent to the cathode on one side of the multi-layered membrane to mitigate hydrogen crossover to the anode side. In other words, the GDL is responsible for the transport of gaseous hydrogen to the cathode side flow field. For a wet cathode PEM operation, liquid water transport across the GDL is needed for heat removal in addition to heat removal from the anode side.

In certain examples, the GDL is made from a carbon paper or woven carbon fabrics. The GDL is configured to allow the flow of hydrogen gas to pass through it. The thickness of the GDL may be within a range of 100-1000 microns, for example. As used herein, a "thickness" by which is film is characterized refers to the distance, or median measured distance, between the top and bottom faces of a film in a direction perpendicular to the plane of the film layer. As used herein, the top and bottom faces of a film refer to the sides of the film extending in a parallel direction of the plane of the film having the largest surface area.

Similarly, one or more additional layers 210 may be present in the electrochemical cell between the membrane 206 and the anode 204. In certain examples, this may include a porous transport layer (PTL) positioned between the membrane 206 (e.g., the anode catalyst layer 207 of the catalyst coated membrane 206) and the anode flow field 204.

In certain examples, the PTL is made from a titanium (Ti) mesh/felt. As used herein, a Ti mesh/felt may refer to a structure created from microporous Ti fibers. The Ti felt structure may be sintered together by fusing some of the fibers together. Ti felt may be made by a special laying process and a special ultra-high temperature vacuum sintering process. The Ti felt may have an excellent three-dimensional network, porous structure, high porosity, large surface area, uniform pore size distribution, special pressure, and corrosion resistance, and may be rolled and processed.

Similar to the GDL, the PTL is configured to allow the transportation of the reactant water to the anode catalyst layers, remove produced oxygen gas, and provide good electrical conductivity for effective electron conduction. In other words, liquid water flowing in the anode flow field is configured to permeate through the PTL to reach the CCM. Further, gaseous byproduct oxygen is configured to be removed from the PTL to the flow fields. In such an arrangement, liquid water functions as both reactant and coolant on the anode side of the cell.

The thickness of the PTL may be within a range of 100-1000 microns, for example. The thickness may affect the mass transport within the cell as well as the durability/deformability and electrical/thermal conductivity of the PTL. In other words, a thinner PTLs compared to thicker PTLs (e.g., 1 mm) may provide better mass transport. However, when the PTL is too thin (e.g., less than 100 microns), the PTL may suffer from poor two phase flow effects as well. PTLs are less prone to deformation compared to GDLs. Thickness of PTLs may also affect lateral electron conduction resistance along the lands in between channels.

In some examples, an anode catalyst coating layer may be positioned between the anode flow field 204 and the PTL.

The cathode flow field 202 and anode flow field 204 of the cell may individually include a flow field plate composed of metal, carbon, or a composite material having a set of channels machined, stamped, or etched into the plate to allow fluids to flow inward toward the membrane or out of the cell.

As noted above, challenges with operation of an electrolytic cell involve defects in the membrane that may not be detected during production but later may further develop and degrade performance of the cell.

For example, certain GDLs may be made from a carbon paper or cloth including carbon fibers. Such compositions are not 100% rigid because of two requirements: (a) the composition is porous to remove H2 from CCM, (b) the composition has some level of compressibility in order to provide manufacturing tolerance of the flow field under compression. Similarly, certain PTLs may be made of a porous titanium felt or sheet and/or sintered Ti fibers or Ti powders. Such PTLs are also not 100% rigid, due to the porosity and morphology of the composition.

Because these GDLs and PTLs are not 100% rigid, when these materials are combined and pressed together with the membrane in between two flow fields, more pressure may be transferred onto the areas on membrane where both land from cathode flow field and land from anode flow field meet than the other areas.

As such, in some cases, the roughness/surface of the GDL or PTL composition (e.g., sintered Ti powder or Ti fibers) and/or the uneven pressure distribution on the adjacent membrane may damage the adjacent membrane structure under the applied pressure. This applied pressure on the membrane by the adjacent GDL or PTL structure may cause a defect, such as a thinning, puncture, or breach of integrity of the membrane. The resulting "hot spot" (a localized temperature increase due to increased current density at the defect) may develop into a soft short circuit or even a hard short circuit over time.

It is important to diagnose an electric soft short circuit (SSC) at an early stage before the soft short circuit develops to a hard short circuit (HSC). The present disclosure describes a procedure for SSC detection and a method to preclude progression of SSC to HSC. Examples of processes for SSC detection are described in greater deal below (see, e.g., FIG. 10).

Defects in the membrane (e.g., a puncture, thinning, or other breach of integrity of porous transporting layers) may be repaired using one or more of the below-described techniques. In certain examples, the repair may be made in a wet cell (e.g., in situ), in a dry cell, using one or more reagents, with the application of voltage to the cell, and/or driven by a pressure differential across the membrane.

In one example, a polymer patch may be deposited by electrochemical polymerization to the place of electric soft short circuit (SSC) on the membrane of a functional or assembled electrolytic cell (e.g., after the cell has been manufactured). An ion exchange membrane healing precursor (e.g., a monomer) may be supplied to the water stream of the functional or assembled electrolytic cell and polymerized to deposit the patch around the area of the SSC with a positive electrochemical potential. Polymerization may take place predominantly at the hot spot of SSC, rather than other areas of the membrane, due to the high localized current density and temperature associated with it. The patch may shut down water electrolysis in the area, thus mitigating the progression of the SSC to a hard short circuit (HSC) and preventing complete failure of the electrolysis cell and the whole stack.

In another example, the defect may be repaired by thermal annealing under dry conditions in the cell. In a further example, the defect may be repaired by thermal activation of a vapor deposition under dry conditions in the cell. In still another example, one or more reagents (e.g., deployed on an anode and a cathode side of the membrane) may react at the site of the defect and heal or repair the membrane under dry or wet conditions in the cell. In still a further example, compounds in solution are dispatched to the defect in the membrane by a pressure difference between opposite sides of the membrane. The compounds accumulate at the defect and may physically or mechanically block or clog the defect, thereby repairing the membrane.

Figure 4:
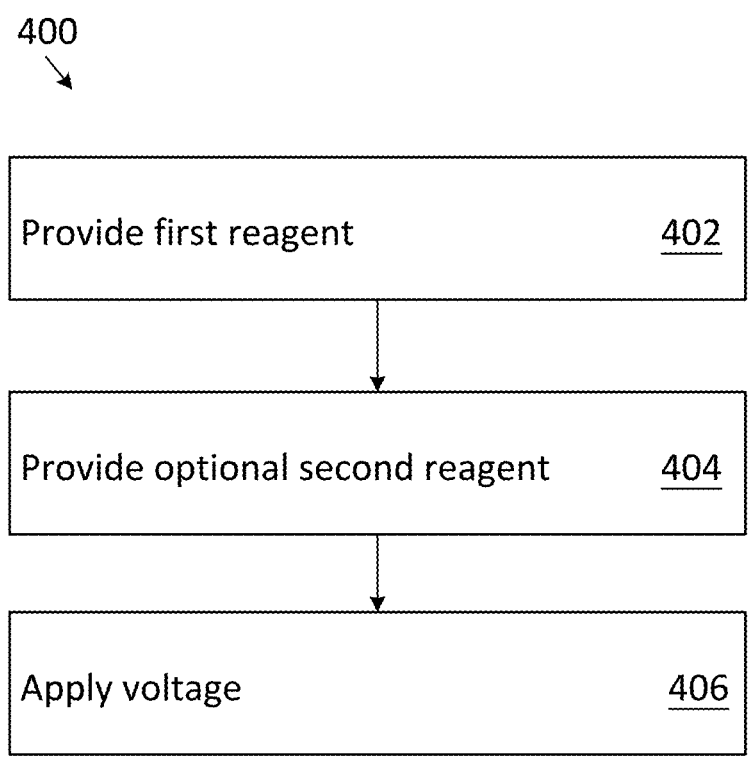
FIG. 4 depicts an example of a flowchart of a method of repairing a membrane defect in a wet cell.

FIG. 4 depicts an example of a flowchart of a method 400 of repairing a membrane defect. One or more reagents (e.g., deployed on an anode and a cathode side of the membrane) may react at the site of the defect and heal or repair the membrane under wet conditions in the cell. One or more of the acts of the method 400 may be omitted. In one example, a second reagent is not used and act 404 is not performed. In another example, act 406 is not performed.

In act 402, a first reagent is provided on a first side of the membrane. The first reagent is dispersed in the water on the first side of the membrane. The first side of the membrane may be either the anode side of the membrane or the cathode side of the membrane.

In act 404, a second reagent is provided on a second side of the membrane opposite the first side.

In certain examples, the first reagent may be a peroxide (e.g., added to the water or present as a result of electrolysis) and may be provided on a side of the membrane nearest the anode of the cell. In one example, the peroxide may include hydrogen peroxide. In other examples, the peroxide may include a peroxy acid such as peroxymonosulfuric acid, peracetic acid, or a derivative thereof (such as a salt thereof). In other examples, the peroxide may include a metal peroxide such as barium peroxide, sodium peroxide, or zinc peroxide. In other examples, the peroxide may include an organic peroxide such as tert-butylhydroperoxide.

In certain examples, the second reagent may be a monomer or polymer derivative of a carboxylic acid (e.g., an ester of a carboxylic acid). For instance, the second reagent may include methyl methacrylate, polymethyl methacrylate, or another monomer or polymer or derivative thereof.

Because the first reagent and/or the second reagent may be provided in the water of the cell without disassembly, the method 400 may be provided in situ. The defect of the membrane may allow for greater mass transport as compared to other areas of the membrane outside of the defect. As a result, the first reagent and the second reagent will mix or contact in greater amounts near the defect.

In act 406, an electrical voltage is applied to the cell. Because a short circuit (e.g., an SSC or an HSC) is present in the cell, the temperature at the site of the defect will rise. In certain examples, an electrical voltage of at least 3 V, 3.5 V, 4 V, 4.5 V, 5 V, 5.5 V or 6 V is applied to the cell. In other examples, a voltage in a range of 3-6 V, 4-5 V, 4.5-5 V, or 4.5-6 V is applied to the cell. By varying the voltage, the temperature may be controlled. The application of an electrical voltage to the cell may assist in raising the temperature of the cell. The temperature may be increased to a minimum or target reaction temperature for the first reagent and/or the second reagent to react. This temperature is variable and may be dictated based on the compounds selected for the first reagent and the second reagent.

Advantageously, when the temperature of the cell is at the minimum or target reaction temperature, the first reagent and the second reagent may come into greater contact at the site of the defect in the membrane (or, e.g., to a greater extent than the reagents flow through other, non-defective, areas of the membrane) and the resulting reaction may be localized at the site of the defect. Further, because the temperature is raised locally at the site of the SC compared to other areas of the membrane, the reaction may be accordingly limited to the site of the SC.

In alternative examples, the first reagent provided in act 402 may be a monomer capable of polymerizing electrochemically. In this way, the membrane may be repaired without use of a second reagent introduced in act 404.

For example, the first reagent may be a monomer that, through polymerization, deposits a polymer patch on the membrane. An example polymerization reaction is described with respect to FIG. 5. The patch repairs the membrane by shutting down the electrochemical processes and limiting the mass transport at the defect, thereby preventing growth of an early SSC (e.g., before the SSC becomes more severe and potentially forms an HSC).

In one case, the monomer may include a heterocyclic compound such as thiophene or an analogous compound such as furan, selenophene, pyrrole, or derivatives thereof. The polymerization of such a heterocyclic compound (e.g., thiophene) may be conducted through oxidation using electrochemical methods such as electropolymerization or electron-transfer reagents.

Additionally, in other examples, a variety of compounds may be polymerized electrochemically from solution by applying positive (e.g., oxidative) potential. For example, polyaniline, polypyrrole, polythiophene, polyphenylene, polycarbazole, poly(phenylenevinylene), poly(thienopyrrole), poly(isothionaphthalene) and combinations or derivates thereof may be generated from a respective monomer compound (e.g., aniline, pyrrole, thiophene, phenylene, carbazole, phenylenevinylene, thienopyrrole, isothionaphthalene) and subsequently used for electrodeposition on various substrates.

Figure 5:
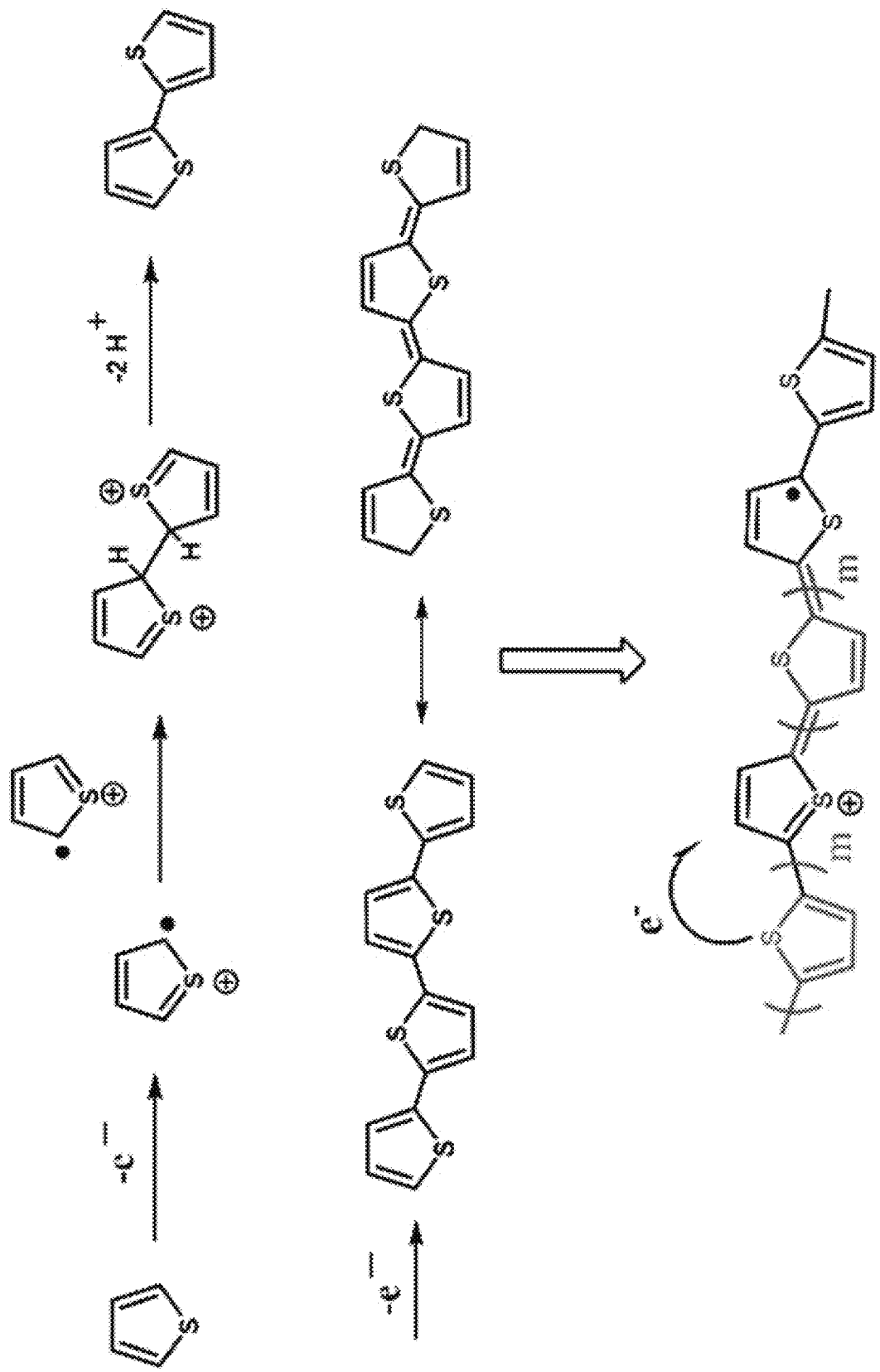
FIG. 5 depicts an example of a polymerization reaction.

FIG. 5 depicts an example polymerization reaction for electrochemical synthesis of polythiophene from thiophene monomer. The polymerization reaction may occur by addition of the reagent (e.g., thiophene) and application of voltage as described with respect to acts 402 and 406, respectively. The reaction proceeds kinetically because of the increased heat localized to the hot spot on the membrane. By choosing a monomer with a polymerization reaction that proceeds at the increased temperature, the polymerization may advantageously be localized to the hot spot and be prohibited, restricted, or reduced in areas away from the hot spot.

In certain examples, the appropriate monomer or precursor may be dissolved in the supplied water for electrochemical deposition of the corresponding polymer at the site of an SSC. For example, once an SSC is discovered by one or more of the tests described herein, the monomer or precursor may be injected into the cell (e.g., to the aqueous solution of the cell) in situ. Monomers such as thiophene and its derivates are suggested because of the stability of such compounds in an oxidative environment. The amount of the monomer added to the water is strictly controlled to avoid deposition of thick polymer layer which may deactivate catalyst and degrade performance of the cell. Additionally, or alternatively, the amount of monomer may be controlled to avoid deposition of the polymer at areas outside of the SSC. The polymerization reaction may be controlled at the SSC and its vicinity. The spatial selectivity of the polymerization may proceed based on high oxidative current and localized heat at the targeted spot (e.g., a hot spot or SSC). The generated polymer deposited at the area of the SSC advantageously patches the area of SSC and creates a seal blocking water supply to the site, therein preventing crossover of the electrolysis gases at the patched hole. As noted above, the formation of a hole at the place of an SSC is an undesired phenomenon as it leads to a highly exothermic reaction of electrolysis gases at the spot, thereby melting the membrane and leading to catastrophic failure of the cell. The dense polymer deposit at the SSC advantageously creates a seal and stops development of an SC at an early stage.

Figure 6:
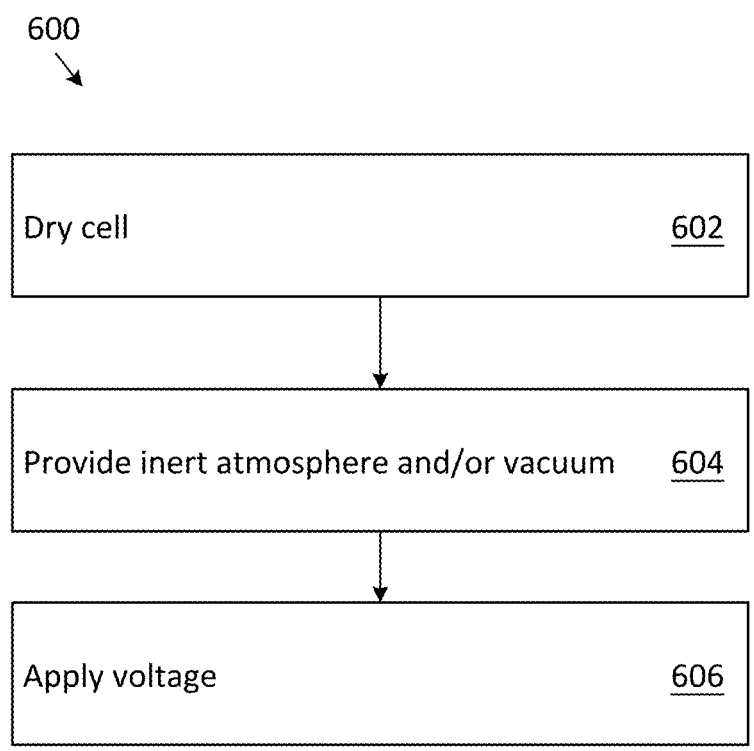
FIG. 6 depicts an example of a flowchart of a method of repairing a membrane defect in a dry cell.

FIG. 6 depicts an additional example of a flowchart of a method 600 of repairing a membrane defect. The membrane may be repaired by thermal annealing under dry conditions in the cell.

In act 602, the cell is dried. In this drying process, water within the cell is drained. Afterward, additional drying may be performed in the presence of a gas (e.g., air or nitrogen) and/or under heat. For example, air or nitrogen may be circulated through the cell through the inlet and outlet lines configured to flow water into the cell and remove the reactant products such as oxygen, hydrogen, and water. The temperature of the cell may alternatively or additionally be increased above ambient temperature (e.g., above 25° C.) to assist in drying the cell. In certain examples, the temperature may be increased to at least 30° C., 40° C., 50° C., 60° C., 70° C., 80° C., 90° C., 100° C., or higher to assist in the drying process.

In act 604, an inert atmosphere or a vacuum is provided in the cell. Because the healing or repairing process involves passing a current through the site of the defect in the membrane (e.g., as described below with respect to act 406), the presence of oxygen may result in combustion of the cell. Accordingly, oxygen within the cell may be flushed by flowing an inert gas through the cell. In some examples, the process in act 602 to dry the cell may also act in flushing or removing oxygen from the cell (e.g., if an inert gas such as nitrogen is used in act 602 for the drying process). In certain examples, in act 604, the cell is filled with an inert gas such as nitrogen or a noble gas. Alternatively, a vacuum may be pulled on the cell for the repair of the membrane.

In act 606, an electrical voltage is applied to the cell. Because a short circuit (e.g., an SSC or an HSC) is present in the cell, the temperature at the site of the defect will raise. In one example, a voltage of at least 3 V, 3.5 V, 4 V, 4.5 V, 5 V, 5.5 V or 6 V is applied to the cell. In other examples, a voltage in a range of 3-6 V, 4-5 V, 4.5-5 V, or 4.5-6 V is applied to the cell. The application of an electrical voltage to the cell will assist in raising the temperature of the cell. The target temperature may be raised to or near the melting point of the membrane material (e.g., within 1° C., within 5° C., or within 10° C. of the melting point of the membrane material) (e.g., Perfluorosulfonic Acid (PFSA)). At this target temperature near the melting point of the membrane material, at least a portion of the membrane may advantageously liquefy and melt or flow, thereby healing or repairing the defect.

Figure 7:
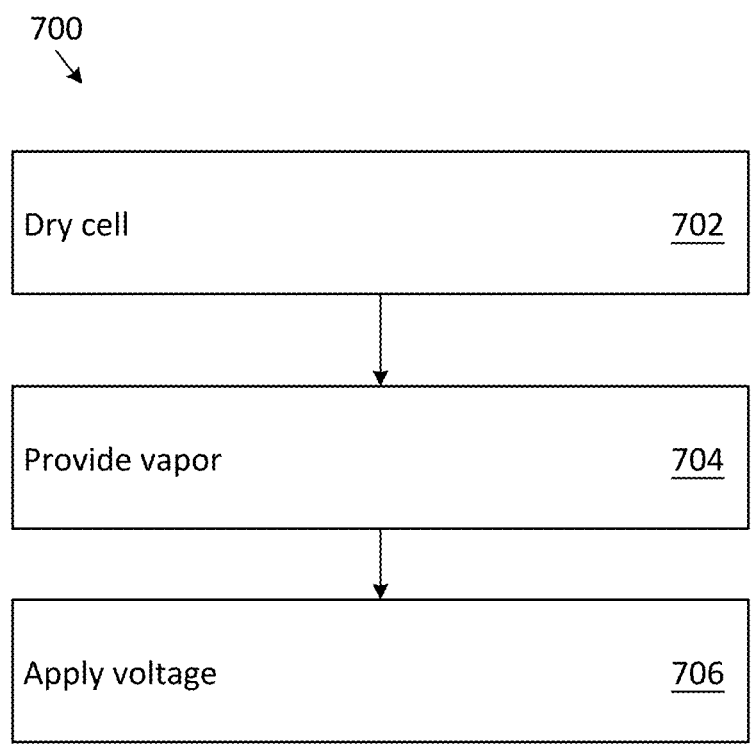
FIG. 7 depicts an example of a flowchart of another method of repairing a membrane defect in a dry cell.

FIG. 7 depicts an example of a flowchart of an additional method 700 of repairing a membrane defect. In this example, the membrane may be repaired by thermal activation of a vapor deposition under dry conditions within the cell.

In act 702, the cell is dried. As noted above, in this drying process, water within the cell is drained. Afterward, additional drying may be performed in the presence of a gas (e.g., air or nitrogen) and/or under heat. For example, air or nitrogen may be circulated through the cell through the inlet and outlet lines configured to flow water into the cell and remove the reactant products such as oxygen, hydrogen, and water. The temperature of the cell may alternatively or additionally be increased above ambient temperature (e.g., above 25° C.) to assist in drying the cell. In certain examples, the temperature may be increased to at least 30° C., 40° C., 50° C., 60° C., 70° C., 80° C., 90° C., 100° C., or higher to assist in the drying process.

In act 704, a thermally-activated vapor or precursor is provided in the cell. The vapor or precursor composition may be provided on one side or both sides of the membrane. Examples of such precursors include silane, dichlorosilane, trichlorosilane, nitrous oxide, tetraethylorthosilicate, ammonia, tungsten hexafluoride, and so on.

In act 706, an electrical voltage is applied to the cell. Because a short circuit (e.g., an SSC or an HSC) is present in the cell, the temperature at the site of the defect will rise. In one example, a voltage of at least 3 V, 3.5 V, 4 V, 4.5 V, 5 V, 5.5 V or 6 V is applied to the cell. In other examples, a voltage in a range of 3-6 V, 4-5 V, 4.5-5 V, or 4.5-6 V is applied to the cell. The application of an electrical voltage to the cell will assist in raising the temperature of the cell. The temperature may be increased to a minimum temperature for the thermally-activated vapor or precursor composition to react or decompose and deposit at the site of the defect. In one example, the temperature may be raised to 95° C. In other examples, the temperature may be raised to the minimum temperature necessary to decompose silane to form and deposit silicon at the membrane or react silane with oxygen to form and deposit silicon oxide.

In certain examples, the precursor may react or decompose from silane into silicon (as well as hydrogen gas). The silicon could be deposited at the surface of the membrane. Alternatively, silane could be reacted with oxygen to form and deposit silicon oxide. These deposition processes at the membrane advantageously provides a patch for the membrane. Further, because the temperature is raised locally to the site of the SC compared to other areas of the membrane, the decomposition and deposition may be accordingly limited to the site of the SC.

Figure 8:
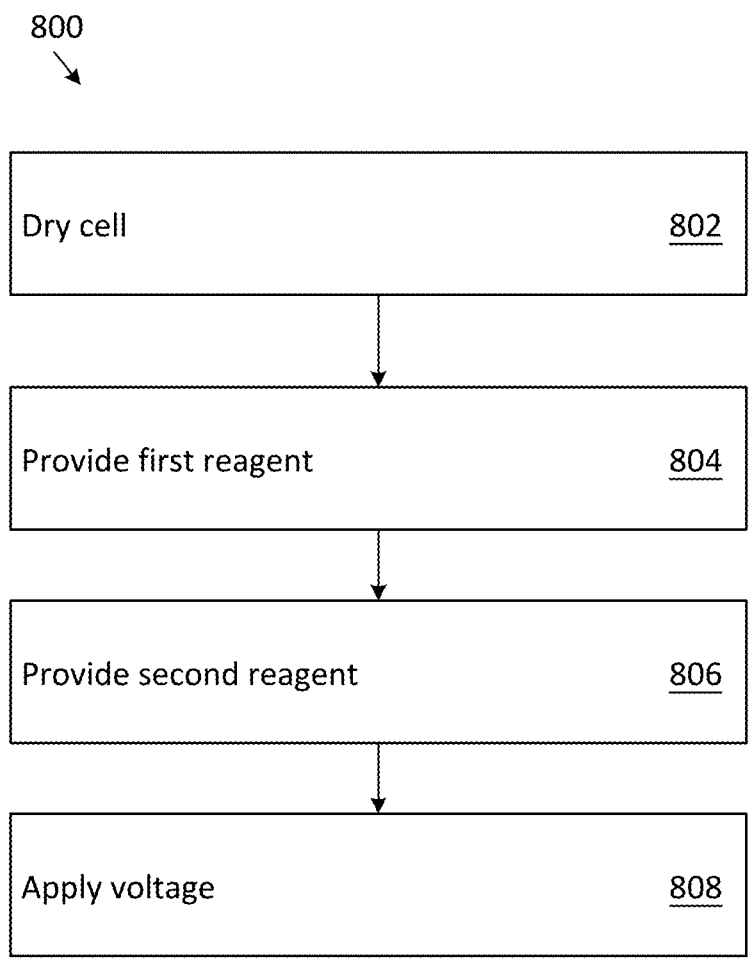
FIG. 8 depicts an example of a flowchart of a further method of repairing a membrane defect in a dry cell.

FIG. 8 depicts an example of a flowchart of another method 800 of repairing a membrane defect. The method 800 repairs the membrane by thermal activation of a reaction between reagents in a dry cell. One or more of the acts of the method 800 may be omitted. In one example, act 808 may not be performed.

In act 802, the cell is dried. As noted above, in this drying process, water within the cell is drained. Afterward, additional drying may be performed in the presence of a gas (e.g., air or nitrogen) and/or under heat. For example, air or nitrogen may be circulated through the cell through the inlet and outlet lines configured to flow water into the cell and remove the reactant products such as oxygen, hydrogen, and water. The temperature of the cell may alternatively or additionally be increased above ambient temperature (e.g., above 25° C.) to assist in drying the cell. In certain examples, the temperature may be increased to at least 30° C., 40° C., 50° C., 60° C., 70° C., 80° C., 90° C., 100° C., or higher to assist in the drying process.

In act 804, a first reagent is provided on a first side of the membrane (e.g., the anode side of the membrane). In act 806, a second vaporous or gaseous reagent is provided on a second side of the membrane opposite the first side of the membrane (e.g., the cathode side of the membrane). The first reagent and/or the second reagent may be a solid, liquid, or gas. For example, the first reagent may be a water-activated urethane that is deposited on one side of the membrane. The second reagent may be water (e.g., present as humidity in air). The urethane and water meet at the defect or hole within the membrane, wherein the urethane is reacted with and cured by the water at the defect. As a result of reacting the reagents, a patch is advantageously provided on the membrane and the defect is repaired.

In act 808, an electrical voltage is applied to the cell. Because a short circuit (e.g., an SSC or an HSC) is present in the cell, the temperature at the site of the defect will rise. By varying the voltage, the temperature may be controlled. As noted above, the voltage may be at least 3 V, 3.5 V, 4 V, 4.5 V, 5 V, 5.5 V or 6 V is applied to the cell. In other examples, a voltage in a range of 3-6 V, 4-5 V, 4.5-5 V, or 4.5-6 V may be applied to the cell. The application of an electrical voltage to the cell will assist in raising the temperature of the cell. The temperature may be raised to a minimum temperature for the first reagent and the second reagent to react. Because the first reagent and the second reagent contact one another or mix at the site of the defect in the membrane (or, e.g., to a greater extent than the reagents flow through other, non-defective, areas of the membrane), the reaction between the reagent may be localized at the site of the defect. Further, because the temperature is raised locally to the site of the SC compared to other areas of the membrane, the reaction may be accordingly limited to the site of the SC.

Figure 9:
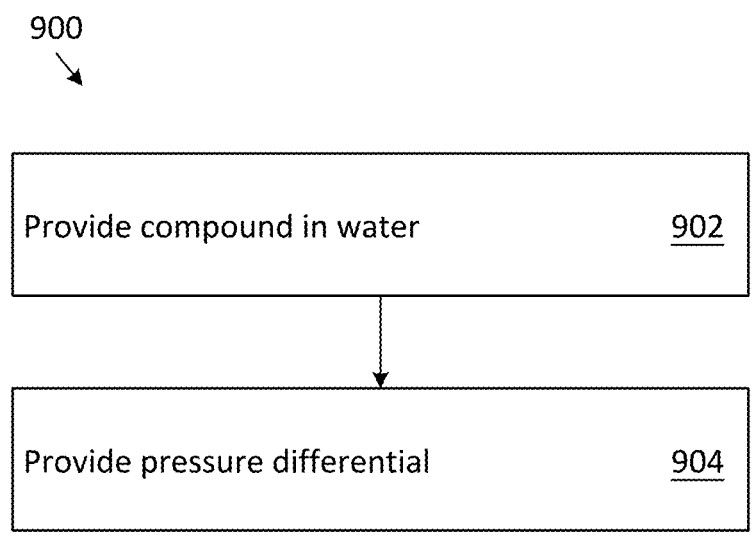
FIG. 9 depicts an example of a flowchart of another method of repairing a membrane defect in a wet cell.

FIG. 9 depicts an example of a flowchart of a still another method 900 of repairing a membrane defect. A compound or composition within the water is driven toward the defect within the membrane by a pressure differential over the cell, wherein the compositions subsequently plugs or fills the defect.

In act 902, a composition is provided in the water of the cell. The composition may be a polymer compound or other micro-capsule composition dispersed in the water. In one example, the composition may include a sulfonated compound configured to clog or plug the hole or defect within the membrane. This may advantageously be achieved through the selection of a compound or composition having a larger size (e.g., a spherical diameter) that is greater than the size of the opening or defect in the membrane. Based on this constraint, a compound having a larger size than the opening in the membrane will fail to flow through the opening, therein advantageously plugging and repairing the defect in the membrane.

In certain examples, perfluorosulfonic acid (PFSA) or a polystyrene or a derivative thereof may be used. A stable dispersion may be formed in the water with the compound.

In act 904, a pressure differential is applied to the cell. During operation of a cell, a pressure differential of at least 1 atm, at least 2 atm, at least 3 atm, at least 4 atm, at least 5 atm, at least 6 atm, at least 7 atm, at least 8 atm, at least 9 atm, at least 10 atm, at least 15 atm, at least 20 atm, at least 25 atm, in a range or 1-25 atm, in a range of 5-20 atm, or in a range of 8-10 atm may be applied across the membrane. For example, the cathodic side of the membrane may be subject to a different pressure than the anodic side of the membrane. In some cases, a greater pressure differential (e.g., a differential of at least 10 atm) across the membrane may aid in transport of the compound to and through the defect in the membrane.

The pressure differential advantageously drives the transfer of water through the membrane. At the site of the defect, the rate of transfer of the water is greater than other parts of the membrane outside of the defect. Accordingly, the compound or composition may have a greater flow rate at the defect. With the greater rate of flow, different parts of the compound or composition may collect at the defect, thereby patching, plugging, clogging, or otherwise repairing the defect in the membrane. As noted above, the compound may have a size (e.g., a spherical shape with a 50 micron diameter) that is larger than a pore size of the membrane, and therefore advantageously does not permeate through the membrane, thereby selectively depositing at the defect instead of other places on the membrane.

As described above, there are several methods for repairing a defect in the membrane of the cell, but the determination of when to facilitate the defect needs to be addressed. For example, a defect or soft short circuit (SSC) within a membrane of a cell may be detected electrochemically through the measurement of a high frequency resistance (HFR), depolarization, an open circuit voltage, a response of the cell to electrochemical impedance spectroscopy (EIS), a voltage degradation over time (e.g., an increase of voltage for electrolysis to occur in the cell), hydrogen generation, heat generation, and/or leaking current. The state of health is assessed regularly during the normal cell operation (e.g., under electrolysis conditions for the electrolytic cell)).

Figure 10:
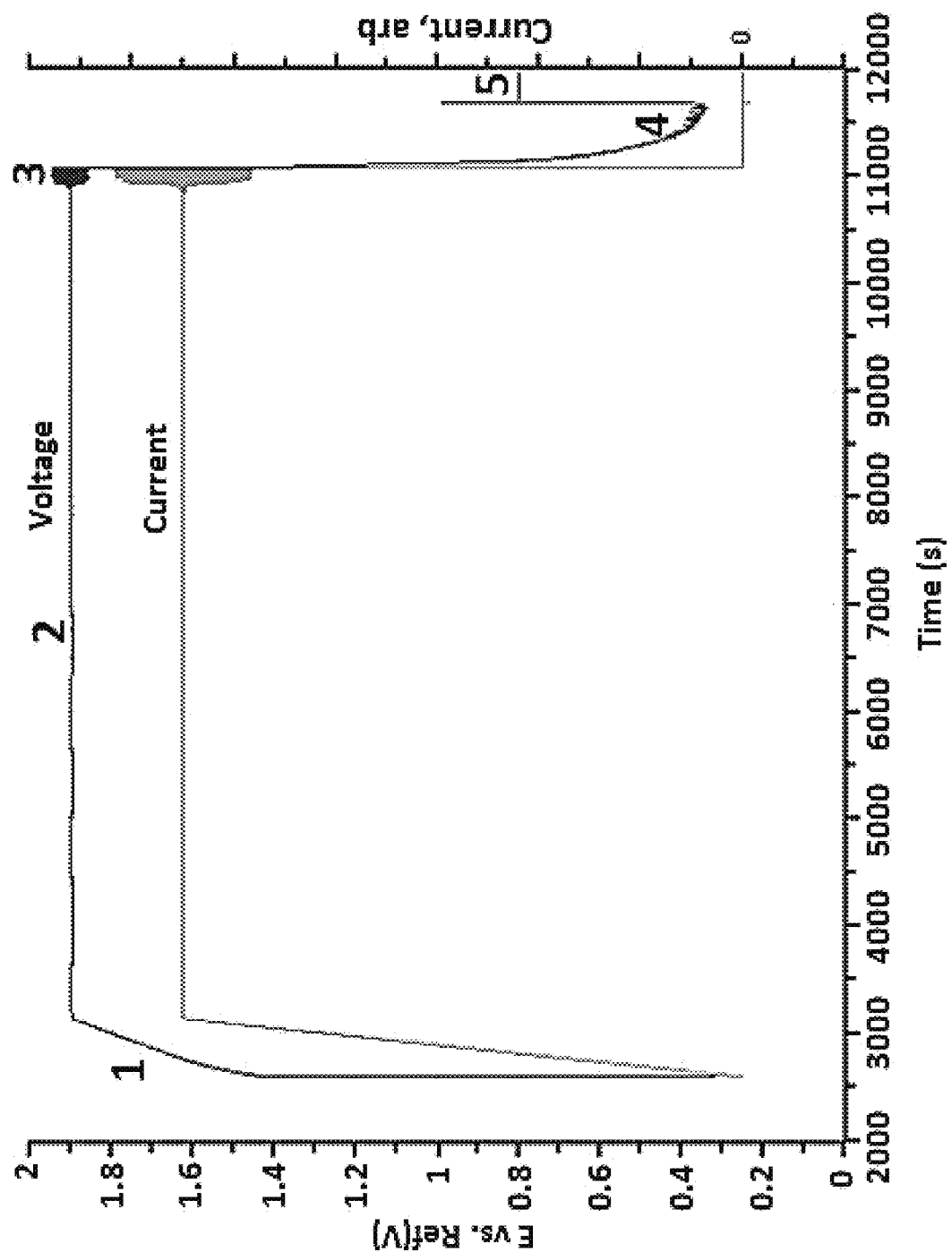
FIG. 10 depicts an example of a plot of voltage and current over time for an electrolytic cell.

FIG. 10 depicts a plot of voltage and current over time for an electrolytic cell. The tests for identifying an SSC are indicated in FIG. 10 by the features performed at times 1-5.

At time 1, the electrolytic cell is brought to a maximum electrolytic current. The ramp to maximum current prepares the cell for electrolysis and testing.

At time 2, electrolysis is performed in the cell. By performing electrolysis, the baseline performance of the cell may be established. The baseline may be compared to performance during the tests.

At time 3, an HFR test is performed. The HFR test measures resistance at the standard current (e.g., the current of the cell at time 2) by performing full electrochemical impedance spectroscopy (EIS) or a single point alternating current (AC) check. The current may be varied from a normal operating point. In one example, the current may be varied between −5% to +5% of the normal operating current. By varying the applied current at a high frequency, the direct current applied to the cell during normal operation may be approximated for the HFR test. The voltage response of the cell to the varying current allows for the HFR to be determined. The HFR test may be performed during normal operation of the electrolysis cell without disruption. Decrease of HFR is indicative of the presence of SSC on the MEA. An SSC in the membrane may result in a reduction of HFR, for example, of less than 5% and/or less than 3%. Additionally or alternatively, the SSC may cause a reduction in HFR of greater than 0.1%. An increase of HFR is indicative of side reactions such as corrosion or catalyst degradation.

At time 4, a depolarization check is performed. The depolarization check may be useful because the two counterparts (e.g., corrosion and SSC) may compensate each other in a measured change of HFR during the above test. For example, corrosion may be present alongside a minor hotspot or SSC, so the measured HFR may not capture the individual contribution of the SSC. In another example, a change in HFR may be caused by varying operating conditions such as changes in temperature.

The depolarization check may be used to determine the severity of an SSC. By measuring a different aspect of the electrolytic cell, the depolarization check may be robust to conditions affecting the HFR test. During the depolarization check, current shuts down (e.g., external current is not supplied to the cell) and open circuit voltage (OCV) across the positive and negative electrodes of the cell is measured. In one example, the OCV is measured for a 10 minute period. However, because shutting down current supply to the cell may cause undesirable reactions in the cell that degrade the performance of the cell, it may be undesirable to measure the OCV for periods of time longer than 10 minutes. The time for voltage to decay to 0 V is indicative of the severity of the SSC. For example, when 0 V is reached quickly, a relatively more severe short (e.g., an HSC) may be present. For example, a severe short may be identified by reaching 0 V in less than 4 minutes. A longer time to reach 0 V (e.g., greater than 4 minutes) may indicate a relatively less severe short (e.g., an SSC). In the case that 0 V is not reached over the observation period, a hot spot, SSC, or HSC may be absent in the cell.

At time 5, leaking current (and/or another characteristic associated with the cell, such as impedance or resistance) is examined. In addition or alternative to measuring the time to reach 0 V in the cell as described above with respect to time 4, the depolarization test is completed by holding potential below the onset potential of electrolysis and measuring leaking current (or an associated characteristic). In one example, the leaking current (or associated characteristic) is examined at a voltage between 0.2 V and 1.3. V, such as 0.2 V, 0.8 V, 1.2 V, or another voltage. In this way, the measured current corresponds to current flowing through the SSC rather than due to any electrolysis occurring in the cell. The value of leaking current represents severity of SSC. In a healthy cell (e.g., without hot spots or SSC), the value of leaking current is, for example, below 1 mA cm$^{-2}$. Any of the three techniques (e.g., measuring HFR, checking depolarization, and measuring leaking current at 0.8 V) or a combination thereof may be used. However, because each test measures a different aspect of cell performance, performing multiple tests may result in more confident diagnosis of SSC.

In some cases, other characteristics of the cell such as impedance and/or resistance may be measured instead of or in addition to the current.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, are apparent to those of skill in the art upon reviewing the description.

As used herein, the singular forms "a," "an," and "the" include plural referents unless the context clearly dictates otherwise.

As used herein, "for example," "for instance," "such as," or "including" are meant to introduce examples that further clarify more general subject matter. Unless otherwise expressly indicated, such examples are provided only as an aid for understanding embodiments illustrated in the present disclosure and are not meant to be limiting in any fashion. Nor do these phrases indicate any kind of preference for the disclosed embodiment.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

It is intended that the foregoing detailed description be regarded as illustrative rather than limiting and that it is understood that the following claims including all equivalents are intended to define the scope of the disclosure. The claims should not be read as limited to the described order or elements unless stated to that effect. Therefore, all embodiments that come within the scope and spirit of the following claims and equivalents thereto are claimed as the disclosure.

The invention claimed is:

1. A method of repairing a membrane of an electrolytic cell, the method comprising:
    identifying a defect in the membrane of the electrolytic cell; and
    repairing the defect in the membrane without disassembling the membrane from adjacent components of the electrolytic cell,
    wherein the repairing comprises one of the following:
        (1) drying the electrolytic cell; providing an inert atmosphere and/or vacuum to the electrolytic cell; and operating the electrolytic cell at a specified voltage at which at least a portion of the membrane liquifies and the defect in the membrane is repaired; or
        (2) drying the electrolytic cell; providing a thermally-activated vapor precursor to the electrolytic cell; and operating the electrolytic cell at the specified voltage, wherein the thermally-activated vapor precursor is configured to react or decompose and deposit a composition at a site of the defect in the membrane; or
        (3) providing a first reagent to the electrolytic cell on a first side of the membrane; and providing a second reagent to the electrolytic cell on a second side of the membrane opposite the first side, wherein the first reagent and the second reagent react at the site of the defect in the membrane to repair the defect in the membrane.

2. The method of claim 1, wherein the identifying of the defect in the membrane comprises measuring a resistance of the electrolytic cell by electrochemical impedance spectroscopy in response to a varied input current, and
    wherein the defect is identified by a decrease in the resistance of the electrolytic cell in comparison to a known resistance value of the electrolytic cell.

3. The method of claim 1, wherein the identifying of the defect in the membrane comprises measuring an open current voltage of the electrolytic cell, and
    wherein the defect is identified by a voltage decaying to zero volts within 10 minutes.

4. The method of claim 1, wherein the identifying of the defect in the membrane comprises measuring a degradation of a voltage of the electrolytic cell, measuring a rate of hydrogen generation within the electrolytic cell, measuring a rate of heat generation within the electrolytic cell, or measuring a current leakage of the electrolytic cell at a test voltage below an electrolysis voltage where the defect identified by the current leakage exceeds 1 mA/cm$^2$.

5. The method of claim 1, wherein the repairing comprises:
    the drying of the electrolytic cell;
    the providing of the inert atmosphere and/or the vacuum to the electrolytic cell; and
    the operating of the electrolytic cell at the specified voltage at which at least of the portion of the membrane liquifies and the defect in the membrane is repaired.

6. The method of claim 5, wherein the providing of the inert atmosphere comprises flowing an inert gas through the electrolytic cell to remove oxygen.

7. The method of claim 1, wherein the drying of the electrolytic cell comprises:
    draining water from the electrolytic cell; and
    flowing air or nitrogen through the electrolytic cell and/or heating the electrolytic cell to a temperature greater than 25° C.

8. The method of claim 1, wherein the specified voltage is at least 4.5 V.

9. The method of claim 1, wherein the repairing comprises:
    the drying of the electrolytic cell;
    the providing of the thermally-activated vapor precursor to the electrolytic cell; and
    the operating of the electrolytic cell at the specified voltage, wherein the thermally-activated vapor precursor is configured to react or decompose and deposit the composition at the site of the defect in the membrane.

10. The method of claim 1, wherein the repairing comprises:
    the providing of the first reagent to the electrolytic cell on the first side of the membrane; and
    the providing of the second reagent to the electrolytic cell on the second side of the membrane opposite the first side,
    wherein the first reagent and the second reagent react at the site of the defect in the membrane to repair the defect in the membrane.

11. The method of claim 10, further comprising:
    operating the electrolytic cell at the specified voltage to control a temperature at the membrane and facilitate a reaction between the first reagent and the second reagent.

12. The method of claim 10, wherein the first reagent comprises a peroxide or a derivative thereof, and
    wherein the second reagent comprises a monomer or polymer derivative of a carboxylic acid.

13. The method of claim 10, further comprising, prior to providing the first reagent and the second reagent:
    drying the electrolytic cell.

14. The method of claim 13, further comprising:
    operating the electrolytic cell at the specified voltage to control a temperature at the membrane and facilitate a reaction between the first reagent and the second reagent.

15. The method of claim 13, wherein the first reagent comprises urethane, wherein the second reagent comprises water, and
wherein the urethane is reacted with and cured by the water at the defect, therein repairing the defect.

16. A method of repairing a membrane of an electrolytic cell, the method comprising:
repairing a defect in the membrane without disassembling the membrane from adjacent components of the electrolytic cell,
wherein the repairing comprises one of the following:
(1) drying the electrolytic cell; providing an inert atmosphere and/or vacuum to the electrolytic cell; and operating the electrolytic cell at a specified voltage at which at least a portion of the membrane liquifies and the defect in the membrane is repaired; or
(2) drying the electrolytic cell; providing a thermally-activated vapor precursor to the electrolytic cell; and operating the electrolytic cell at the specified voltage, wherein the thermally-activated vapor precursor is configured to react or decompose and deposit a composition at a site of the defect in the membrane; or
(3) providing a first reagent to the electrolytic cell on a first side of the membrane; and providing a second reagent to the electrolytic cell on a second side of the membrane opposite the first side, wherein the first reagent and the second reagent react at the site of the defect in the membrane to repair the defect in the membrane.

17. The method of claim 16, wherein the repairing comprises:
the drying of the electrolytic cell;
the providing of the inert atmosphere and/or the vacuum to the electrolytic cell; and
the operating of the electrolytic cell at the specified voltage at which the portion of the membrane liquifies and the defect in the membrane is repaired.

18. The method of claim 16, wherein the repairing comprises:
the drying of the electrolytic cell;
the providing of the thermally-activated vapor precursor to the electrolytic cell; and
the operating of the electrolytic cell at the specified voltage, wherein the thermally-activated vapor precursor is configured to react or decompose and deposit the composition at the site of the defect in the membrane.

19. The method of claim 16, wherein the repairing comprises:
the providing of the first reagent to the electrolytic cell on the first side of the membrane; and
the providing of the second reagent to the electrolytic cell on the second side of the membrane opposite the first side,
wherein the first reagent and the second reagent react at the site of the defect in the membrane to repair the defect in the membrane.

20. The method of claim 19, further comprising:
operating the electrolytic cell at the specified voltage to control a temperature at the membrane and facilitate a reaction between the first reagent and the second reagent.

21. A method of repairing a membrane of an electrolytic cell, the method comprising:
repairing a defect in the membrane without disassembling the membrane from adjacent components of the electrolytic cell,
wherein the repairing comprises:
adding a compound within water to a cathode side of the membrane; and
providing a pressure differential across the membrane, wherein the pressure differential is at least 1 atm,
wherein a diameter of the compound is larger than an opening in the membrane, and
wherein the pressure differential causes the water having the compound to flow across the membrane at which the compound plugs the opening in the membrane and repairs the defect.

22. The method of claim 21, wherein the compound is a polymer or microcapsule compound dispersed in the water.

23. The method of claim 22, wherein the compound comprises perfluorosulfonic acid (PFSA), polystyrene, or a derivative thereof.

* * * * *